United States Patent
Kerber et al.

(10) Patent No.: US 8,994,072 B2
(45) Date of Patent: Mar. 31, 2015

(54) REDUCED RESISTANCE SIGE FINFET DEVICES AND METHOD OF FORMING SAME

(71) Applicant: International Business Machines Corporation, Armonk, NY (US)

(72) Inventors: Pranita Kerber, Mount Kisco, NY (US); Qiping C. Ouyang, Yorktown Heights, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/022,917

(22) Filed: Sep. 10, 2013

(65) Prior Publication Data

US 2014/0361338 A1 Dec. 11, 2014

Related U.S. Application Data

(63) Continuation of application No. 13/911,177, filed on Jun. 6, 2013.

(51) Int. Cl.
*H01L 29/66* (2006.01)
*H01L 29/78* (2006.01)
*H01L 29/165* (2006.01)

(52) U.S. Cl.
CPC ............ *H01L 29/785* (2013.01); *H01L 29/165* (2013.01)
USPC ......................................... 257/192; 257/331

(58) Field of Classification Search
USPC .................................................. 257/192, 331
See application file for complete search history.

(56) References Cited

U.S. PATENT DOCUMENTS

| 6,835,618 | B1 | 12/2004 | Dakshina-Murthy et al. |
| 6,921,982 | B2 | 7/2005 | Joshi et al. |
| 6,972,461 | B1 | 12/2005 | Chen et al. |
| 7,198,995 | B2 | 4/2007 | Chidambarrao et al. |
| 7,361,556 | B2 | 4/2008 | Adkisson et al. |
| 7,902,014 | B2 | 3/2011 | Doyle et al. |
| 8,159,018 | B2 | 4/2012 | Akil et al. |
| 2006/0014366 | A1 | 1/2006 | Currie |
| 2010/0200916 | A1 | 8/2010 | Gossner et al. |
| 2010/0327321 | A1 | 12/2010 | Bhuwalka et al. |

*Primary Examiner* — Tan N Tran
(74) *Attorney, Agent, or Firm* — Daniel P. Morris; Ryan, Mason & Lewis, LLP

(57) ABSTRACT

A method for forming a fin field-effect transistor (FinFET) device, comprises forming a plurality of silicon fins on a substrate, depositing silicon germanium (SiGe) on the plurality of fins, forming a gate region by forming a dummy gate stack on a predetermined area of the fins including the SiGe, removing the SiGe from an area of the fins not covered by the dummy gate stack, forming a merged region in the area of the fins not covered by the dummy gate stack to form a source drain region, removing the dummy gate stack to expose the remaining SiGe in the gate region, mixing the SiGe with the silicon fins in the gate region to form SiGe fins, and depositing a gate dielectric and gate metal on the SiGe fins.

5 Claims, 9 Drawing Sheets

REDUCED RESISTANCE SIGE FINFET DEVICES AND METHOD OF FORMING SAME

CROSS-REFERENCE TO RELATED APPLICATION

This application is a Continuation of U.S. application Ser. No. 13/911,177, filed on Jun. 6, 2013, the disclosure of which is incorporated herein in its entirety by reference.

TECHNICAL FIELD

The field generally relates to FinFET devices and, in particular, to a FinFET device having a SiGe channel region and method for forming same.

BACKGROUND

A fin field-effect-transistor (FinFET) is a non-planar, multi-gate transistor having a structure that rises above a planar substrate, resulting in more volume than a planar gate for the same planar area. FinFETs include a gate which wraps around a conducting channel, and which has been referred to as a fin. Due to the wrapped around structure, relatively little current leaks through the body when the device is in the off state, resulting in lower threshold voltages, and more optimal switching speeds and power.

Silicon germanium (SiGe) FinFET devices have been proposed as an alternative to silicon (Si) FinFET devices. SiGe is able to provide pFET voltage thresholds (VTs) of, for example, about 0.25V, compared to silicon counterparts, which give VTs of greater than 0.5V. In addition, SiGe pFET devices typically have higher channel mobility than silicon pFET devices.

Boron has been used as a p-type dopant for source/drain (SD) and extension formation in pFETs. However, boron diffusivity is lower in SiGe than in silicon and, as a result, the SiGe devices are likely to be underlapped and have high access resistance. As a result, the high channel mobility may not translate to higher performance.

Accordingly, there is a need for a FinFET device that is able to utilize the voltage threshold benefits of SiGe without sacrificing boron diffusivity for source drain and extension formation.

SUMMARY

In general, exemplary embodiments of the invention include FinFET devices and, in particular, FinFET devices having a SiGe channel region and method for forming same.

According to an exemplary embodiment of the present invention, a method for forming a fin field-effect transistor (FinFET) device, comprises forming a plurality of silicon fins on a substrate, depositing silicon germanium (SiGe) on the plurality of fins, forming a gate region by forming a dummy gate stack on a predetermined area of the fins including the SiGe, removing the SiGe from an area of the fins not covered by the dummy gate stack, forming a merged region in the area of the fins not covered by the dummy gate stack to form a source drain region, removing the dummy gate stack to expose the remaining SiGe in the gate region, mixing the SiGe with the silicon fins in the gate region to form SiGe fins, and depositing a gate dielectric and gate metal on the SiGe fins.

According to an exemplary embodiment of the present invention, a fin field-effect transistor (FinFET) device, comprises a substrate, a gate structure formed on the substrate, the gate structure comprising a gate dielectric and gate metal, and a silicon germanium (SiGe) fin formed under the gate dielectric and the gate metal, and a source drain region adjacent the gate structure, wherein the source drain region comprises a merged epitaxial region including a dopant, and a silicon fin, and a junction between the silicon fin and SiGe, wherein the junction comprises the dopant from the merged epitaxial region.

These and other exemplary embodiments of the invention will be described or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which.

DETAILED DESCRIPTION OF EXEMPLARY EMBODIMENTS

Exemplary embodiments of the invention will now be discussed in further detail with regard to FinFET devices and, in particular, FinFET devices having a SiGe channel region and method for forming same. This invention may, however, be embodied in many different forms and should not be construed as limited to the embodiments set forth herein.

The embodiments of the present invention include heterojunction FinFET devices (e.g., pFinFET devices) and methods of manufacturing the same, wherein the SiGe forms the channel and the source/drain junctions are made of silicon. This design maintains the low-$V_T$ (threshold voltage) obtained by using a SiGe pFET, while reducing the access resistance since the source drain and extension junctions are made of silicon instead of SiGe. As a result, the diffusivity of boron in silicon, which is higher relative to that in SiGe, leads to an overlapped junction and lower resistance. In addition, the embodiments of the present invention result in higher channel mobility and higher performance.

It is to be understood that the various layers and/or regions shown in the accompanying drawings are not drawn to scale, and that one or more layers and/or regions of a type commonly used in FinFET devices may not be explicitly shown in a given drawing. This does not imply that the layers and/or regions not explicitly shown are omitted from the actual FinFET devices. Moreover, the same or similar reference numbers used throughout the drawings are used to denote the same or similar features, elements, or structures, and thus, a detailed explanation of the same or similar features, elements, or structures will not be repeated for each of the drawings.

The FinFET devices and methods for forming same in accordance with the embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the FinFET devices are contemplated embodiments of the invention. Given the teachings of the embodiments of the invention provided herein, one of ordinary skill in the art will be able to contemplate other implementations and applications of embodiments of the invention.

Figure 1:
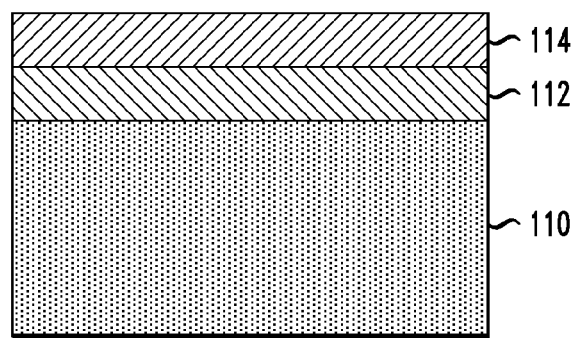
FIG. 1 is a cross-sectional view illustrating formation of buried oxide (BOX) and silicon on insulator (SOI) layers in a method of manufacturing a FinFET device, according to an exemplary embodiment of the invention.

Referring to FIG. 1, which is a cross-sectional view illustrating formation of buried oxide (BOX) and silicon-on-insulator (SOI) layers in a method of manufacturing a FinFET device, according to an exemplary embodiment of the invention, a BOX layer 112 is formed on a semiconductor substrate 110, and an SOI layer 114 is formed on the BOX layer 112.

Figure 2A:
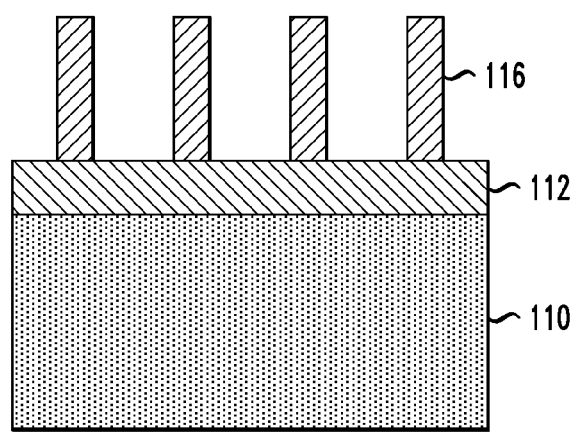
FIGS. 2A and 2B are cross-sectional and top views, respectively, illustrating fin formation in a method of manufacturing a FinFET device, according to an exemplary embodiment of the present invention.
Figure 2B:
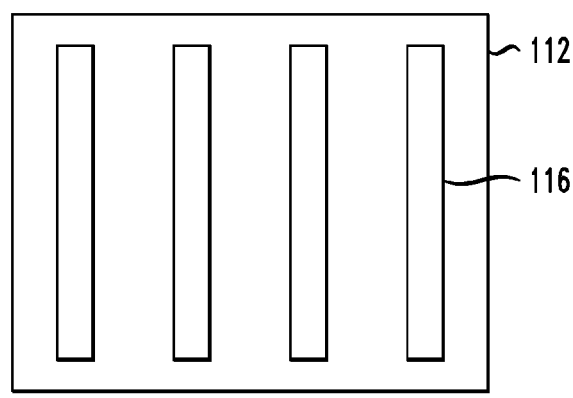

Referring to FIGS. 2A and 2B, which are cross-sectional and top views, respectively, illustrating fin formation in a method of manufacturing a FinFET device, according to an exemplary embodiment of the present invention, fins 116 are formed by patterning the SOI layer 114. Patterning is performed by, for example, image transfer and etching. In FIG. 2A the cross-section is taken along a line perpendicular to the fins 116.

Figure 3A:
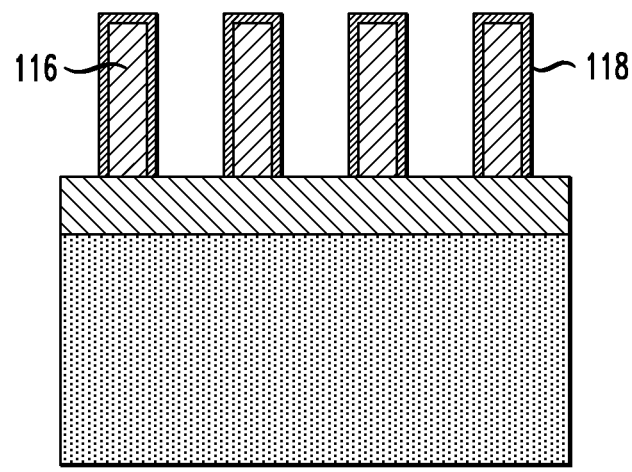
FIGS. 3A and 3B are cross-sectional and top views, respectively, illustrating deposition of SiGe on fins in a method of manufacturing a FinFET device, according to an exemplary embodiment of the invention.
Figure 3B:
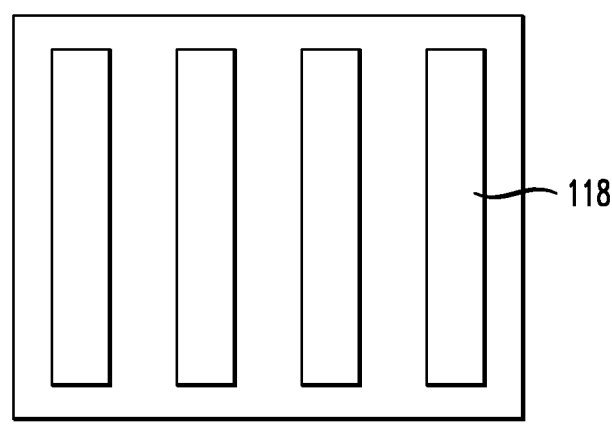

Referring to FIGS. 3A and 3B, which are cross-sectional and top views, respectively, illustrating deposition of SiGe on fins in a method of manufacturing a FinFET device, according to an exemplary embodiment of the invention, SiGe 118 is deposited on the fins on substrate 110, in a selective epitaxial process, which deposits the SiGe on exposed silicon, (e.g., on the fins 116, not separately on the oxide 112). As can be seen from the views in FIGS. 3A and 3B, the SiGe 118 is deposited over the structure including the sides and tops of the fins 116. In accordance with embodiments of the present invention, about 40% to about 100% germanium fraction SiGe is deposited, and a thickness of the fins is about 5 nm, measured in a left to right direction in FIG. 3A. In accordance with an embodiment, a thickness of the SiGe 118 covering the fins 116 is about 2 nm, resulting in an overall fin thickness of 9 nm. Depending on design constraints, the percentage of germanium and the thicknesses of the fins and SiGe can be varied.

Figure 4A:
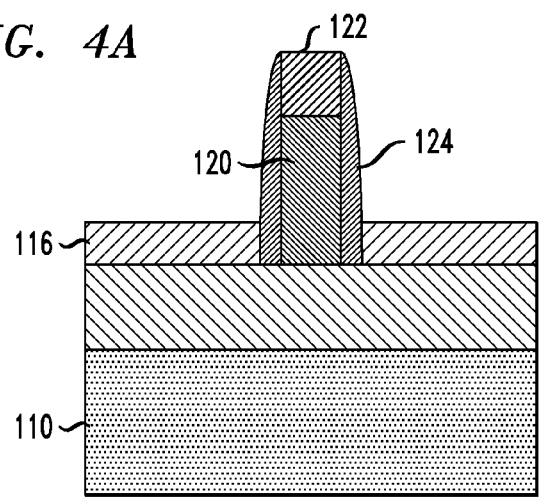
FIGS. 4A, 4B and 4C are two cross-sectional views and a top view, respectively, illustrating deposition and patterning of a dummy gate stack and spacer, and removal of exposed SiGe in the source and drain regions in a method of manufacturing a FinFET device, according to an exemplary embodiment of the invention.
Figure 4B:
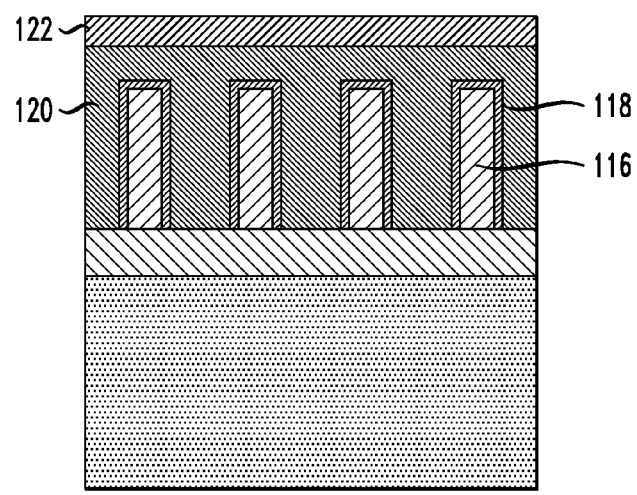
Figure 4C:
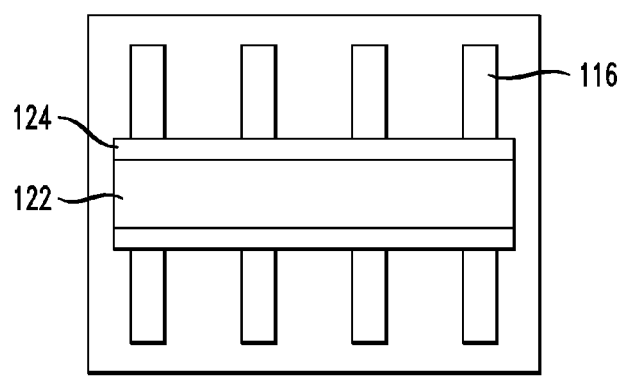

FIGS. 4A, 4B and 4C are two cross-sectional views and a top view, respectively, illustrating deposition and patterning of a dummy gate stack and spacer, and removal of exposed SiGe in the source drain regions in a method of manufacturing a FinFET device, according to an exemplary embodiment of the invention. A dummy or sacrificial gate stack layer is deposited on the resulting structure from FIGS. 3A and 3B, and patterned to form dummy gate stack 120 around sides and on upper surfaces of designated portions of the fins 116 for the gate areas. In accordance with an embodiment, a gate hardmask 122, for example, a nitride, or any dielectric or combination of dielectric layers, is formed on the dummy gate stack 120. The cross-section in FIG. 4A is taken along a line parallel to the fins 116, and the cross-section in FIG. 4B is taken along a line perpendicular to the fins 116 and cutting through the dummy gate 120.

A spacer layer is also deposited on the resulting structure of FIGS. 3A-3B, and is patterned by, for example, reactive ion etching (RIE) to form spacer pattern 124 along sides of the dummy gate stack and hardmask 120, 122. The spacer pattern 124 isolates the gate stack 120 from the source drain regions on either side of the gate stack 120. In accordance with an embodiment of the present invention, an extension implant (not shown) may be performed.

Referring to FIGS. 4A-4C, the SiGe layer 118 on the fins 116 under the dummy gate stack 120 and spacer 124 remains, but is removed from the fins 116 in exposed regions (i.e., source drain regions) not covered by the gate stack 120 and the spacer 124. In accordance with an embodiment, some of the SiGe under the spacer 124 will be etched during the SiGe removal process, moving the extension (described further below) closer to the channel. The SiGe layer 118 is removed from the exposed regions using, for example, HCl gas etch, or wet etches, such as, for example, hydrogen peroxide $H_2O_2$, especially at higher SiGe concentrations, or SC1 clean (1:1:5 solution of $NH_4OH$ (ammonium hydroxide)+$H_2O_2$ (hydrogen peroxide)+$H_2O$ (water)). According to an embodiment, an HCl gas etch is performed prior to the epitaxial merge step, in an epitaxial reactor. Performing the HCl gas etch in this manner will not add an extra process step, resulting instead in, for example, a few additional seconds of process time. Removal of the SiGe from the silicon fin in the epitaxial reactor just prior to the epitaxial merge epitaxy is beneficial in regards to surface cleanliness.

Figure 5A:
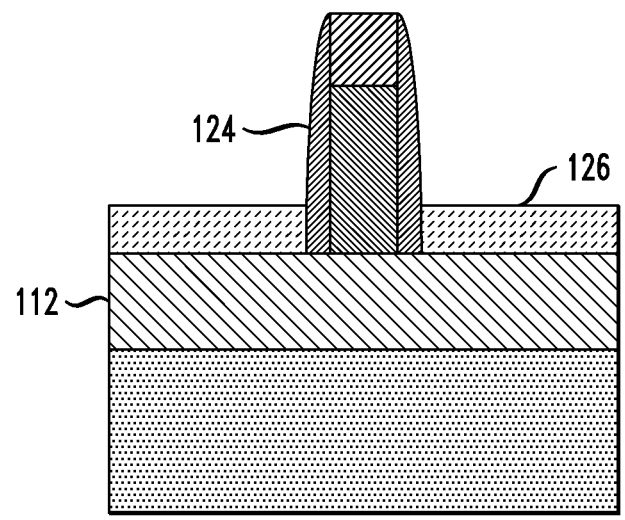
FIGS. 5A and 5B are cross-sectional and top views, respectively, illustrating merging of the SD region in a method of manufacturing a FinFET device, according to an exemplary embodiment of the invention.
Figure 5B:
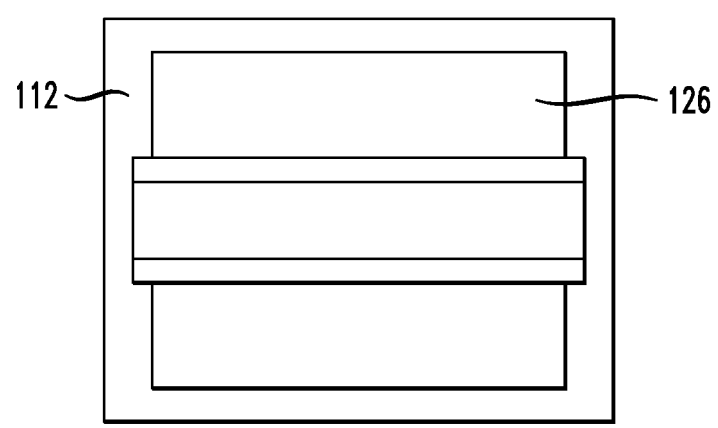

Referring to FIGS. 5A and 5B, which are cross-sectional and top views, respectively, illustrating merging of the SD region in a method of manufacturing a FinFET device, according to an exemplary embodiment of the invention, the fins 116 forming the SD region are merged by epitaxially growing SiGe and/or silicon on the exposed Si surfaces of the fins 116 so that the fins 116 contact each other through the merged region 126 in an integrated structure. According to an embodiment, merging is performed with epitaxial in-situ boron doped silicon. The merged epitaxy region 126 can be in-situ doped with boron or other appropriate impurity. According to another embodiment, merging is performed with in-situ boron doped SiGe. In another alternative embodiment, merging is performed and subsequent ion implantation can follow the epitaxial merging process. In accordance with an embodiment of the present invention, in-situ doping and the dopant being substitutionally incorporated during epitaxial deposition is performed without activation annealing. The doping level can be about $1 \times 10^{20}$ to about $1.5 \times 10^{21}$ cm$^3$, for example, about $4 \times 10^{20}$ to about $8 \times 10^{20}$ cm$^3$. In accordance with another embodiment of the present invention, a junction anneal step, such as rapid thermal annealing (RTA) or laser spike annealing (LSA), can follow the merging and/or the ion implantation step to activate the source drain dopants.

Since dopant diffusivity is higher in silicon than in SiGe, the source drain dopant atoms are able diffuse through the silicon fins 116 to form junctions. As a result, overlapped low resistance source drain junction formation is possible.

Figure 11:
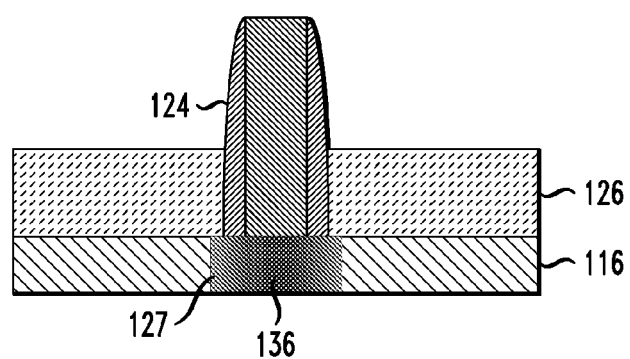
FIG. 11 is a cross-sectional view taken along line III-III' in FIG. 10C through a fin, and additionally showing deposited gate metal, according to an exemplary embodiment of the invention.

Boron diffusion is low in SiGe, even in low percentage SiGe. In the case of boron doped SiGe forming the merged region 126, the boron doped SiGe wraps around the fin in the source drain region. The drive in anneal is performed to diffuse the boron from the SiGe into the silicon fin. Referring to FIG. 11 explained further below, the boron diffused inside the silicon fin 116 toward the gate forming the extension forms the boron doped silicon junction 127 under spacer 124, which connects to the later formed SiGe fin 136.

Figure 6A:
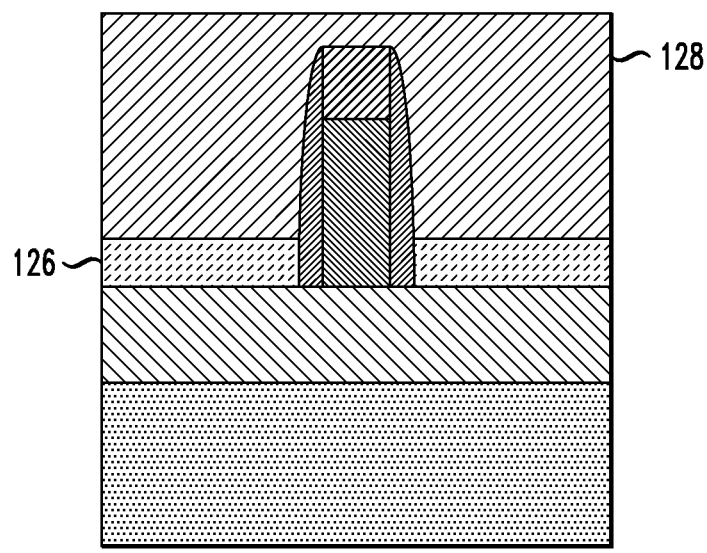
FIGS. 6A and 6B are cross-sectional and top views, respectively, illustrating deposition of a field dielectric in a method of manufacturing a FinFET device, according to an exemplary embodiment of the invention.
Figure 6B:
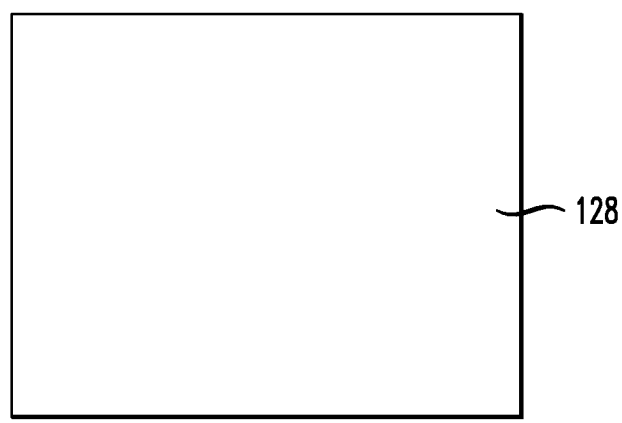

Referring to FIGS. 6A and 6B, which are cross-sectional and top views, respectively, illustrating deposition of a field dielectric in a method of manufacturing a FinFET device, according to an exemplary embodiment of the invention, a field dielectric layer 128, for example, an oxide, is formed on the substrate 110 including the BOX layer 112, merged epitaxy region 126 (i.e., source drain region), and the gate structure including the dummy gate, gate hardmask and spacers 120, 122 and 124. In accordance with an embodiment of the present invention, silicide can be formed on gate and source drain regions prior to deposition of the field dielectric layer.

Figure 7A:
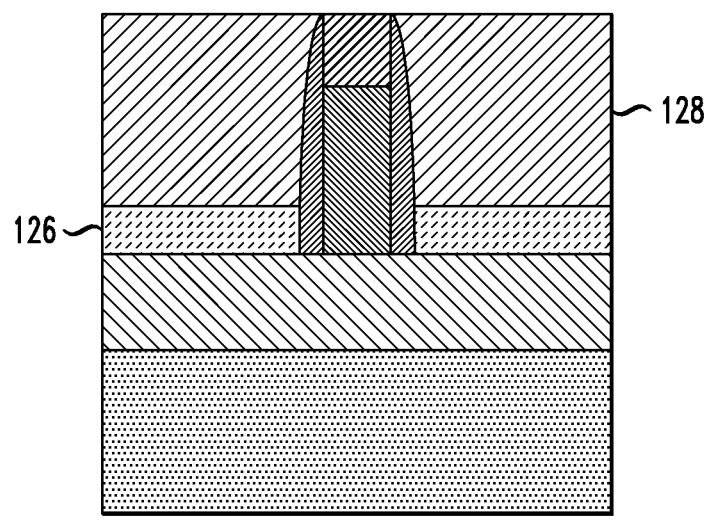
FIGS. 7A and 7B are cross-sectional and top views, respectively, illustrating chemical mechanical polishing (CMP) of the field dielectric in a method of manufacturing a FinFET device, according to an exemplary embodiment of the invention.
Figure 7B:
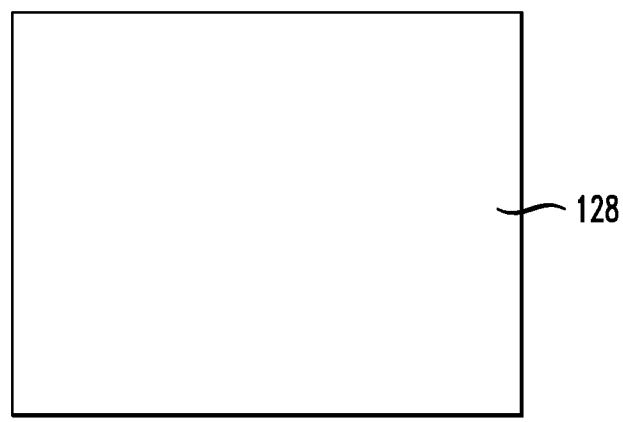

Referring to FIGS. 7A and 7B, which are cross-sectional and top views, respectively, illustrating chemical mechanical polishing (CMP) of the field dielectric in a method of manufacturing a FinFET device, according to an exemplary embodiment of the invention, the field dielectric layer 128 is planarized down to the gate hardmask 122, using, for example, chemical mechanical polishing (CMP).

Figure 8A:
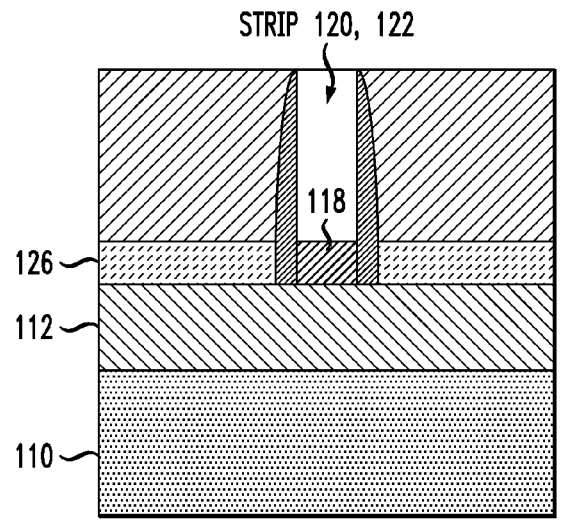
FIGS. 8A, 8B and 8C are two cross-sectional views and a top view, respectively, illustrating stripping of a gate hardmask and dummy gate layers in a method of manufacturing a FinFET device, according to an exemplary embodiment of the invention.
Figure 8B:
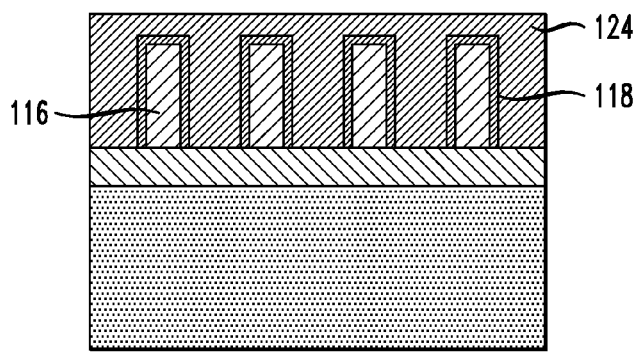
Figure 8C:
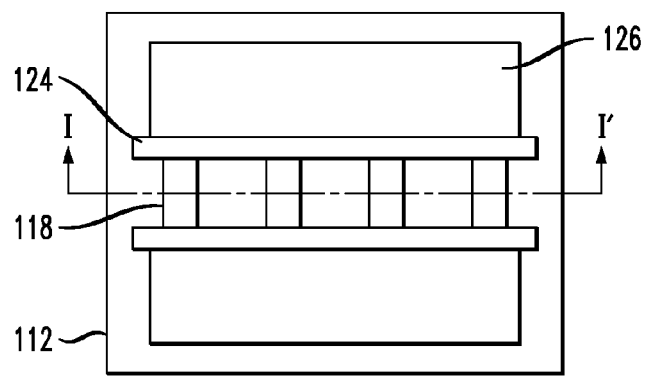

FIGS. 8A, 8B and 8C are two cross-sectional views and a top view, respectively, illustrating stripping of a gate hardmask and dummy gate layers 122, 120 in a method of manufacturing a FinFET device, according to an exemplary embodiment of the invention. Dummy gate layer 120 and gate hardmask 122 are stripped by timed RIE to remove the gate hard mask and part of poly-silicon. RIE is very selective to inverse lithography technology (ILT) using high density plasma (HDP) oxide. The remaining poly-silicon is removed by hot ammonia (NH$_4$OH). FIG. 8A is a cross-section taken along a line parallel to the fins, and FIG. 8B is a cross-section taken along line I-I' perpendicular to the fins.

Stripping of the gate hardmask 122 and the dummy gate layer 120 leaves exposed the SiGe layer 118 that remained under the gate structure after formation of the dummy gate 120 and the gate hardmask 122 in FIGS. 4A-4C.

Figure 9A:
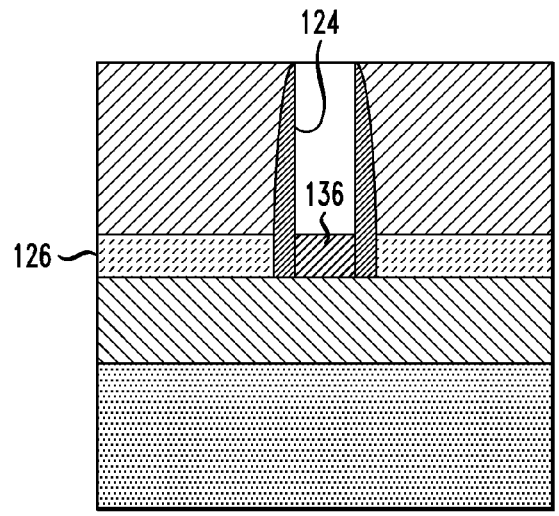
FIGS. 9A, 9B and 9C are two cross-sectional views and a top view, respectively, illustrating Si/SiGe intermixing annealing and oxide stripping in a method of manufacturing a FinFET device, according to an exemplary embodiment of the invention.
Figure 9B:
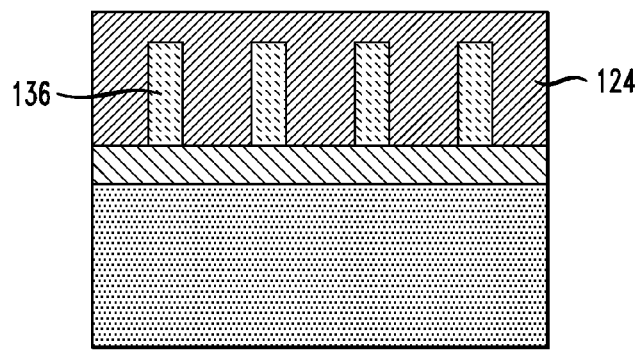
Figure 9C:
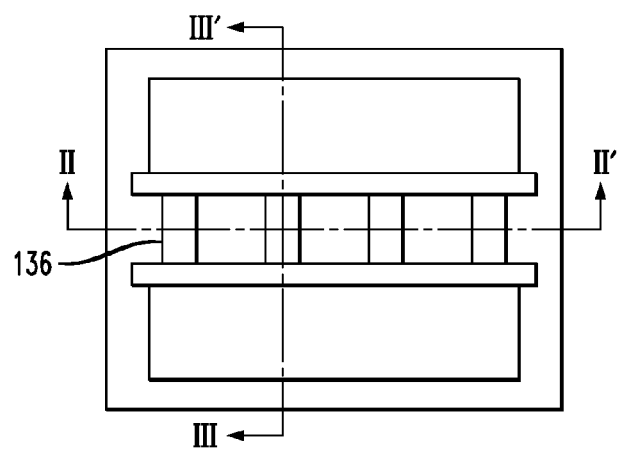

FIGS. 9A, 9B and 9C are two cross-sectional views and a top view, respectively, illustrating Si/SiGe intermixing annealing and oxide stripping in a method of manufacturing a FinFET device, according to an exemplary embodiment of the invention.

At this stage, thermal mixing is performed to convert the portion of the silicon fins 116 in the gate region into SiGe fins 136. The anneal process can be furnace anneal, rapid thermal anneal, flash anneal, or any suitable combination of those processes. The anneal temperature ranges from about 600 degrees to about 1300 degrees Centigrade. The anneal time ranges from about 1 millisecond to about 2 hours, depending on the anneal temperature. Higher anneal temperatures require shorter anneal times. According to an embodiment, a typical anneal condition is about 2 minutes at 900° C. Such annealing causes the mixing of the germanium containing layer and the crystalline silicon layer in the pFET region of the structure.

In connection with the mixing, according to an embodiment, a selectively removable material can be put into the open dummy gate trench to maintain the fin shape during the anneal step.

In accordance with an embodiment of the present invention, post cleans may consume about 1 nm of the SiGe layer 118 resulting in modified fins 136 that are about 7 nm thick after processing and are about 20% to about 50% SiGe and about 80% to about 50% silicon given, for example, about 40% to about 100% germanium fraction SiGe mentioned above. The percentage of germanium in the deposited SiGe can be varied to result in a desired SiGe:Si ratio. For example, 50% SiGe and 50% silicon can be formed by depositing 100% germanium and performing thermal mixing. Mixing can be achieved by thermal oxidation and drive in of SiGe into the silicon fin, which may cause some material loss due to oxide formation. In accordance with embodiments of the present invention, the resulting oxide can be stripped in a controlled and selective manner with minimal loss by, for example, chemical oxide removal (COR) and/or plasma assisted etching. Alternatively, the mixing can be accomplished using an inert gas to minimize loss of material. Inert gases include argon, and helium, for example.

Figure 10A:
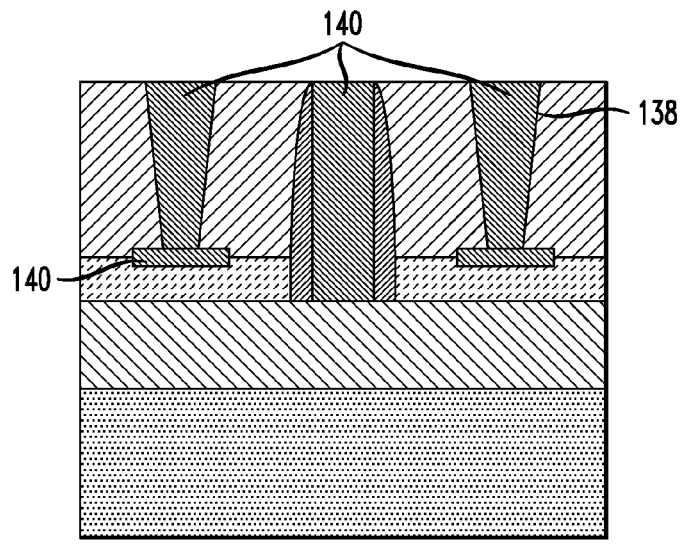
FIGS. 10A and 10B are cross-sectional and top views, respectively, illustrating deposition of a gate dielectric and gate metal, and formation of SD and gate contacts in a method of manufacturing a FinFET device, according to an exemplary embodiment of the invention.
Figure 10B:
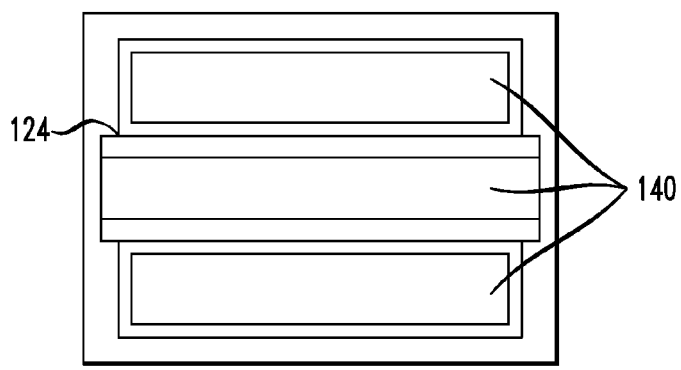

FIGS. 10A and 10B are cross-sectional and top views, respectively, illustrating deposition of a gate dielectric and gate metal, and formation of source drain and gate contacts in a method of manufacturing a FinFET device, according to an exemplary embodiment of the invention. After formation of the SiGe fins 136, a gate dielectric (not shown) is deposited on upper and side surfaces of the fins 136, followed by gate metal 140 deposited on the upper and side surfaces of the fins 136 including the gate dielectric layer. In accordance with embodiments of the present invention, the gate metal 140 may include, for example silicide and tungsten, but is not limited thereto. The gate metal 140 is also deposited in vias 138 formed in the field dielectric layer 128 to form the source drain contacts.

FIG. 10A illustrates a structure after forming a gate structure including a gate dielectric material portion and a gate conductor material portion within a gate cavity. In one embodiment, the gate dielectric material portion (not shown) has a bottommost portion in direct contact with upper and side surfaces of the SiGe fins 136. The gate dielectric material portion can be a high k material having a dielectric constant greater than silicon oxide. Exemplary high k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g. silicon oxide, and a high k gate dielectric can be formed.

The gate dielectric material portion can be formed by any deposition technique including, for example, chemical vapor deposition (CVD), plasma enhanced chemical vapor deposition (PECVD), physical vapor deposition (PVD), sputtering, and atomic layer deposition.

After providing the gate dielectric material portion, the gate metal 140 can be formed atop the gate dielectric material portion and filling the remaining space of each gate cavity. The gate metal 140 can include any conductive metal material including, for example, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) and multilayered combinations thereof. The gate metal 140 can be formed utilizing a deposition process including, for example, chemical vapor deposition (CVD), plasma enhanced chemical vapor deposition (PECVD), physical vapor deposition (PVD), sputtering, atomic layer deposition (ALD) and other like deposition processes. When a metal silicide is formed, a conventional silicidation process is employed.

FIG. 11 is a cross-sectional view taken along line III-II' in FIG. 9C through the fin 136, and additionally showing the deposited gate metal 140 from FIGS. 10A and 10B. As mentioned above, according to an embodiment, the merged region 126 includes, for example, boron doped silicon or SiGe, which, as shown by the cross-sectional view in FIG. 11, is wrapped around the silicon fin 116 in the source drain region. In other words, the silicon fins 116 are wrapped with boron doped material. Since dopant diffusivity is higher in silicon than in SiGe, the source drain dopant atoms (e.g., boron) are able diffuse through the silicon forming the merged region 126 to form junctions 127 under the spacers 124 close to the SiGe fin 136 under the gate 140. As a result, overlapped low resistance source drain junction formation is possible. The mixed SiGe region 136 under the gate 140 is diffused out toward the spacer 124. The SiGe is thermally mixed into the silicon fin in the gate region and also under the spacer 124 to form the mixed SiGe region 136. During this thermal mix, according to an embodiment, anneal in-situ boron dopant is diffused from the merged epitaxy 126 to the junctions 127 via the silicon fin 116 with boron driven in from the merged epitaxy. The thermal anneal step oxidizes the silicon in the SiGe around the fin and drives the remaining Ge into the fin to form an SiGe fin 136. Toward the spacer 124 and source drain region, the SiGe fin is connected to the silicon part of the same fin.

The drive in anneal is performed to diffuse the boron from merged region 126 into the silicon-fin 116. The boron diffused inside the fin toward the gate forming the extension forms the boron doped silicon under spacer 124, which connects to the later formed SiGe fin 136.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

We claim;

1. A fin field-effect transistor (FinFET) device, comprising:
a substrate;
a gate structure formed on the substrate, the gate structure comprising:
a gate dielectric and gate metal; and
a silicon germanium (SiGe) fin formed under the gate dielectric and the gate metal; and
a source drain region adjacent the gate structure, wherein the source drain region comprises:
a merged epitaxial region including a dopant; and
a silicon fin; and
a junction between the silicon fin and the SiGe fin, wherein the junction comprises the dopant from the merged epitaxial region.

2. The FinFET device according to claim 1, further comprising a spacer formed adjacent the gate structure, wherein the junction is formed under the spacer.

3. The FinFET device according to claim 1, wherein a percentage of SiGe in the SiGe fin in the gate structure is greater than about 20%.

4. The FinFET device according to claim 1, wherein the merged epitaxial region is wrapped around the silicon fin in the source drain region.

5. The FinFET device according to claim 1, wherein the merged epitaxial region comprises at least one of in situ boron doped SiGe or in situ boron doped silicon on silicon.

* * * * *